(12) United States Patent
Johnson

(10) Patent No.: US 6,404,284 B1
(45) Date of Patent: Jun. 11, 2002

(54) AMPLIFIER BIAS ADJUSTMENT CIRCUIT TO MAINTAIN HIGH-OUTPUT THIRD-ORDER INTERMODULATION DISTORTION PERFORMANCE

(75) Inventor: Douglas Matthew Johnson, Lansdale, PA (US)

(73) Assignee: Anadigics, Inc., Warren, NJ (US)

( * ) Notice: Subject to any disclaimer, the term of this patent is extended or adjusted under 35 U.S.C. 154(b) by 0 days.

(21) Appl. No.: 09/837,987

(22) Filed: Apr. 19, 2001

(51) Int. Cl.[7] .............................. H03F 1/26; H03G 3/20; H03G 3/10
(52) U.S. Cl. ..................... 330/149; 330/129; 330/140; 330/285
(58) Field of Search ................................. 330/129, 140, 330/149, 285

(56) References Cited

U.S. PATENT DOCUMENTS

| | | | |
|---|---|---|---|
| 3,443,241 A | 5/1969 | Pitzalis, Jr. ................. 330/29 |
| 3,486,128 A | 12/1969 | Lohrmann ................... 330/40 |
| 3,996,524 A | 12/1976 | Sechi .......................... 330/35 |
| 4,237,425 A | 12/1980 | Spiegel ..................... 330/263 |
| 4,317,083 A | 2/1982 | Boyd ......................... 330/296 |
| 4,331,930 A | 5/1982 | Shibata et al. ............. 330/267 |
| 4,439,743 A | 3/1984 | Schwarz et al. ............ 330/267 |
| 4,521,740 A | 6/1985 | Nakayama .................. 330/267 |
| 4,754,231 A | 6/1988 | Sawa ......................... 330/279 |
| 4,882,547 A | 11/1989 | Katz .......................... 330/149 |
| 4,970,456 A | 11/1990 | Holcomb et al. ............. 324/95 |
| 5,055,797 A | 10/1991 | Chater ....................... 330/268 |
| 5,101,175 A | 3/1992 | Vaisanen .................... 330/279 |
| 5,121,081 A | 6/1992 | Hori ........................... 330/279 |
| 5,136,257 A | 8/1992 | Reading ..................... 330/129 |
| 5,172,068 A | 12/1992 | Childs ........................ 328/162 |
| 5,214,393 A | 5/1993 | Aihara ........................ 330/279 |
| 5,216,379 A | 6/1993 | Hamley ...................... 330/134 |
| 5,302,913 A | 4/1994 | Hori ........................... 330/129 |
| 5,307,512 A | 4/1994 | Mitzlaff ...................... 455/126 |
| 5,420,536 A | 5/1995 | Faulkner et al. ............ 330/149 |
| 5,432,473 A | 7/1995 | Mattila et al. .............. 330/133 |
| 5,457,811 A | * 10/1995 | Lemson ...................... 359/194 |
| 5,497,123 A | 3/1996 | Main et al. .................. 330/257 |
| 5,511,239 A | 4/1996 | Dennerlein et al. ......... 455/126 |
| 5,524,285 A | 6/1996 | Wray et al. ................. 455/126 |
| 5,585,762 A | 12/1996 | Dekker ....................... 330/144 |
| 5,589,796 A | 12/1996 | Alberth, Jr. et al. ........ 330/133 |
| 5,589,797 A | * 12/1996 | Gans et al. .................. 330/110 |
| 5,625,322 A | 4/1997 | Gourgue et al. ............. 330/129 |
| 5,640,691 A | 6/1997 | Davis et al. ................. 455/126 |
| 5,656,972 A | 8/1997 | Norimatsu ................... 330/129 |
| 5,659,253 A | 8/1997 | Busking ...................... 324/648 |
| 5,659,893 A | 8/1997 | Enoki et al. ................. 455/126 |
| 5,712,593 A | 1/1998 | Buer et al. .................. 330/129 |
| 5,724,005 A | 3/1998 | Chen et al. ................. 330/279 |
| 5,732,334 A | 3/1998 | Miyake ....................... 455/126 |
| 5,784,689 A | 7/1998 | Kobayashi ................... 455/126 |
| 5,896,064 A | 4/1999 | Kaku .......................... 330/279 |
| 6,307,436 B1 | * 10/2001 | Hau ............................ 330/149 |

* cited by examiner

Primary Examiner—Robert Pascal
Assistant Examiner—Patricia T. Nguyen
(74) Attorney, Agent, or Firm—Pennie & Edmonds LLP

(57) ABSTRACT

An circuit and method are provided for amplifying RF input signal to produce RF output signals with third-order intermodulation distortion products. The circuit and method use a feedback signal to control the bias voltage of the amplifier, such that the output third-order intermodulation distortion product increases monotonically with the RF input signal power. Specifically, the third-order intermodulation distortion product responds over a predetermined output power range by increasing three decibels in response to each one-decibel increase in input power.

22 Claims, 3 Drawing Sheets

AMPLIFIER BIAS ADJUSTMENT CIRCUIT TO MAINTAIN HIGH-OUTPUT THIRD-ORDER INTERMODULATION DISTORTION PERFORMANCE

FIELD OF THE INVENTION

The present invention relates generally to radio-frequency (RF) power amplifiers. More particularly, the invention relates to an RF power amplifier circuit that includes a bias adjustment circuit that causes the output signal of the amplifier to contain an amount of intermodulation distortion that increases linearly (on a log scale) as the output power increases.

BACKGROUND OF THE INVENTION

An RF power amplifier is a circuit that is capable of receiving an RF input signal and amplifying it to produce an RF output signal. RF power amplifiers are frequently used in communications systems, such as cable-television systems (CATV). They normally include bipolar junction transistors or field-effect transistors as amplifying elements, and, if so, they also invariably include a bias circuit that sets the quiescent operating point of the transistor. (The quiescent operating point of a transistor is the "point on the family of characteristic curves . . . that corresponds to the average electrode voltages or currents in the absence of a signal." JOHN MARKUS, ELECTRONICS DICTIONARY 445 (4th ed. 1979). The quiescent operating point of a bipolar junction transistor includes such parameters as quiescent base-emitter current, quiescent base-emitter voltage, quiescent collector-emitter current, and quiescent collector-emitter voltage.)

In such transistor-based power amplifiers, there are tradeoffs between maximizing efficiency and ensuring that the desired amplification characteristics are maintained. The efficiency of an amplifier, or output circuit efficiency, is the amplifier's signal output power divided by the power supplied to the amplifier by the power supply. The former quantity—the signal output power—is determined by the gain of the amplifier and the input drive level (or signal input power). The latter quantity—the power supplied to the amplifier by the power supply—is largely determined by the quiescent operating point of the amplifier. An amplifier with a high quiescent operating point will draw a large amount of power from the power supply, and the amplifier will have a low efficiency. Conversely, an amplifier with a low quiescent operating point will draw a small amount of power from the power supply, and the amplifier will have a high efficiency. In summary, the relationship among efficiency, signal output power, and quiescent operating point is this: the lower the quiescent operating point and the higher the signal output power, the higher the efficiency of the amplifier.

But an amplifier with a low quiescent operating point and a high signal output power will produce (in addition to an amplified RF signal) large intermodulation and harmonic distortion signals. Harmonics, or noise signals having frequencies that are integer multiples of the signal frequency f(i.e., 2f, 3f, etc.) are generated when a pure sinusoidal waveform is clipped. If clipping occurs when more than one signal is simultaneously applied to an amplifier, then intermodulation distortion (hereinafter, "IMD") occurs in addition to harmonic generation.

For amplifiers with less than a one-octave bandwidth, the dominant IMD term is the third-order component. The theoretical power of such third-order MD products resulting from waveform clipping increases by about three decibels for every one-decibel increase in signal input power, provided that the highest-order term in the nonlinearity of the amplifier is cubic. In other words, if the theoretical power (in decibels) of the third-order IMD is graphed against the signal input power (in decibels), the result is a straight line having a slope of about 3:1. This graph of the third-order IMD versus input power level is referred to hereinafter as the theoretical 3:1 curve.

In practice, however, real amplifiers contain nonlinear processes that cause the third-order IMD produced to deviate from the theoretically-calculated amount. The power of the IMD caused by these nonlinear processes is determined by the vector addition of the components generated by each nonlinear process. Such terms may partially cancel or add, depending on the frequency and phase of the components. As a consequence, the actual third-order IMD does not follow the theoretical 3:1 curve. As the output power increases, rather, the third-order IMD tends to deviate more and more from the theoretically-predicted 3:1 curve, and the rate of increase of IMD with input power may become 4:1, 5:1 or even worse.

The inventor of the present invention has recognized that this unpredictable variation in IMD from the theoretically-predicted 3:1 curve causes problems to designers of CATV systems, who must be able to calculate signal power and distortion power at each point in a cascaded CATV system. The calculations are normally performed using large spreadsheet programs making use of the assumption that the IMD produced by each amplifier follows the theoretical 3:1 curve. But the calculations are inaccurate if the third-order IMD produced is greater or less than the amount that is theoretically predicted. Thus, it would be desirable to have an RF amplifier that produces a predictable amount of IMD, in accordance with the theoretical 3:1 curve.

Existing techniques for compensating for excessive IMD are not adequate to this task. A first known technique is to decrease or attenuate the power level of the amplifier input signal. A decrease in input power causes a corresponding decrease in the output power of the amplifier, so that the third-order intermodulation and harmonic distortion is reduced to acceptable levels. The useful output power range over which the amplifier can be used is therefore limited, in order to avoid excessive IMD. This limitation in output power range is highly undesirable.

A second technique that has been used to compensate for excessive distortion is described in U.S. Pat. No. 5,712,593 (hereinafter, the '593 patent). According to this technique, there is selected a power level of total distortion (including both harmonic and intermodulation distortion) that is acceptable in the output of the amplifier. An adjustable bias circuit is then employed to continually adjust the operating point of the amplifier, depending on the power of the distortion in the output of the amplifier, so that the power level of distortion that is acceptable is maintained. If the power of the distortion is too high, the operating point of the amplifier is raised to a point at which the amplifier operates more linearly and produces less distortion. Conversely, if the power of the distortion is lower than the acceptable amount, the operating point of the amplifier is lowered, thereby improving the efficiency of the amplifier but increasing the distortion produced by the amplifier.

Although the system of the '593 patent successfully maintains the total distortion in the output of an amplifier at a predetermined power level, however, it does not accomplish the desired objective of causing the third-order IMD to increase at the 3:1 rate. Rather, in the system of the '593 patent, the power level of the third-order IMD in the output of the amplifier remains at approximately the same level as the power of the input signal increases, because the amplifier bias voltage is continually adjusted to maintain the level of distortion constant. Thus, the technique of the '593 patent does not fulfill the need for predictability in amplifier performance.

OBJECT OF THE INVENTION

It is accordingly an object of the invention to provide an amplifier bias adjustment that maintains the theoretically-expected 3:1 third-order IMD slope for output power.

SUMMARY OF THE INVENTION

The invention is directed to a circuit for amplifying an input RF signal. The circuit comprises the following elements: (1) an RF amplifier circuit that amplifies the input RF signal and produces an output RF signal that comprises a third-order IMD product signal; (2) a power divider circuit that divides a signal output from the RF amplifier circuit into the output RF signal and a feedback signal; (3) a feedback circuit comprising an RF detector that detects the feedback signal and produces a DC voltage proportional to the power of the feedback signal that is used to bias the RF amplifier circuit. With this circuit, the third-order IMD product signal responds, over a predetermined range of power of the output RF signal, by increasing substantially three decibels in response to each one-decibel increase in the level of the input RF signal. Preferably, the feedback circuit further comprises a DC level shifter and a DC amplifier to amplify and shift the level of the DC voltage before it is used to bias the RF amplifier circuit.

In one embodiment, the power divider circuit produces the RF output signal and the feedback signal with equal strength. Preferably, though, the power divider circuit produces the RF output signal and the feedback signal with unequal strength. In a preferred embodiment, the feedback signal has a strength at least ten decibels less than the RF output signal. The power divider circuit may comprise a coupler with a ferrite core. Alternatively, it may comprise a resistor or any other circuitry that divides power. The RF amplifier circuit preferably comprises a monolithic gallium arsenide (GaAs) metal-semiconductor field-effect transistor (MESFET). The detector circuit preferably comprises a DC blocking capacitor, a detector diode, a DC bias inductor, a DC bias resistor, and an RF bypass capacitor.

The invention is also directed to a method for amplifying an input RF signal to produce an output RF signal that comprises a third-order IMD product signal, where the third-order IMD product signal responds over a predetermined range of power of the output RF signal by increasing substantially three decibels in response to each one-decibel increase in the level of the input RF signal. The method comprises the following steps: (1) amplifying the input RF signal in an amplifier to produce an amplified signal; (2) dividing the amplified signal into an output RF signal and a feedback signal; (3) generating a DC signal with a DC voltage proportional to the power of the feedback signal; and (4) biasing the amplifier based on the DC signal. Preferably, the method further comprises the steps of amplifying the DC signal and level-shifting the DC voltage before using it to bias the amplifier.

In one embodiment, the step of dividing produces the RF output signal and the feedback signal with equal strength. Preferably, though, this step produces the RF output signal and the feedback signal with unequal strength. In a preferred embodiment, the feedback signal has a strength at least ten decibels less than the RF output signal. The step of dividing may be performed with a circuit that comprises a coupler with a ferrite core. Alternatively, it may be performed with a circuit that comprises a resistor or any other circuitry that divides power. The amplifier preferably comprises a monolithic GaAs MESFET. The step of generating a DC signal is preferably performed with a circuit that comprises a DC blocking capacitor, a detector diode, a DC bias inductor, a DC bias resistor, and an RF bypass capacitor.

DETAILED DESCRIPTION OF THE INVENTION

The invention relates to an amplifier device wherein the theoretical 3:1 third-order IMD power slope is maintained. This is achieved by using a feedback mechanism that adjusts the bias current, increasing it as a function of output power, to keep the third-order IMD on this theoretical slope.

Figure 1:
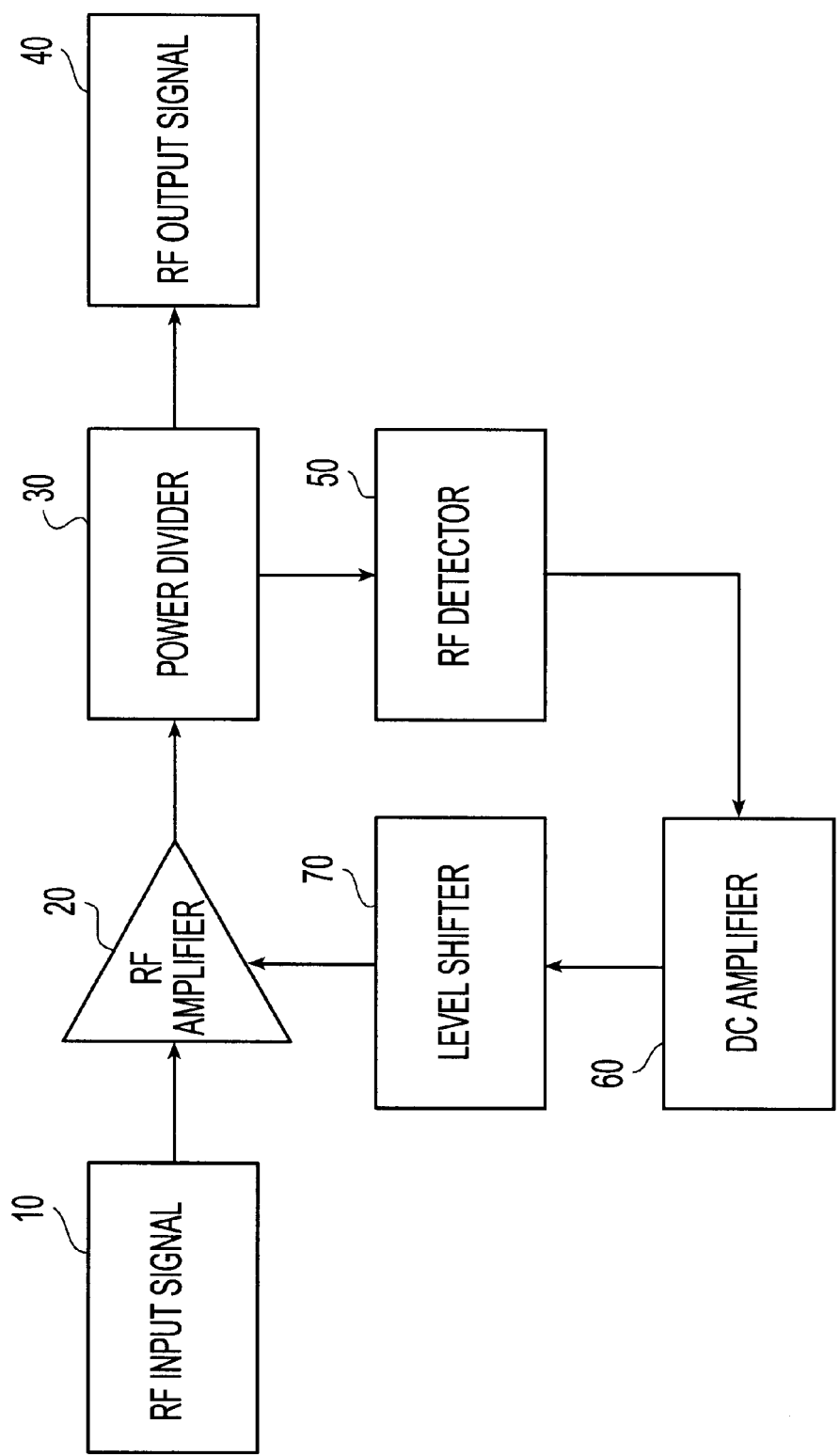
FIG. 1 is a block diagram illustrating the feedback circuit of the invention used to maintain the theoretically-expected 3:1 third-order IMD slope for output power.

The feedback circuit is illustrated in FIG. 1. RF input signal 10 is amplified by the circuit, producting RF output signal 40. RF input signal 10 is first amplified by RF amplifier 20. The amplified signal is then fed into a power divider 30. In one embodiment, the RF amplifier 20 is a monolithic GaAs metal-semiconductor field-effect transistor ("MESFET") circuit, although alternative amplifiers are also within the scope of the invention. Such alternative amplifiers include, but are not limited to, amplifiers formed from different types of transistors, including other field-effect transistors as well as bipolar junction transistors.

Power divider 30 samples the power of the amplified signal and feeds it into RF detector 50. In one embodiment, power divider 30 is a simple power divider with an equal power split. In a preferred embodiment, however, power divider 30 provides an unequal split, with the signal fed to RF detector 50 having a strength less than that for RF output signal 40. This is to minimize the through loss of the RF signal. Preferably, the strength of the signal fed to RF detector 50 is at least 10 dB less than the strength of RF output signal 40. In one embodiment, the power divider 30 is a coupler fabricated using a ferrite core. In an alternative embodiment, the power divider 30 comprises a resistor or other circuitry that divides power.

RF detector 50 produces a DC voltage that is proportional to the RF signal power input from RF power divider 30. This DC signal is fed back to RF amplifier 20, preferably through a DC amplifier 60 and a level shifter 70. The function of DC amplifier 60 and level shifter 70 are to ensure that the DC signal that is fed back into RF amplifier 20 increases the DC bias in the RF amplifier 20 as a function of the RF output power such that the third-order IMD remains on the 3:1 slope.

Figure 2:
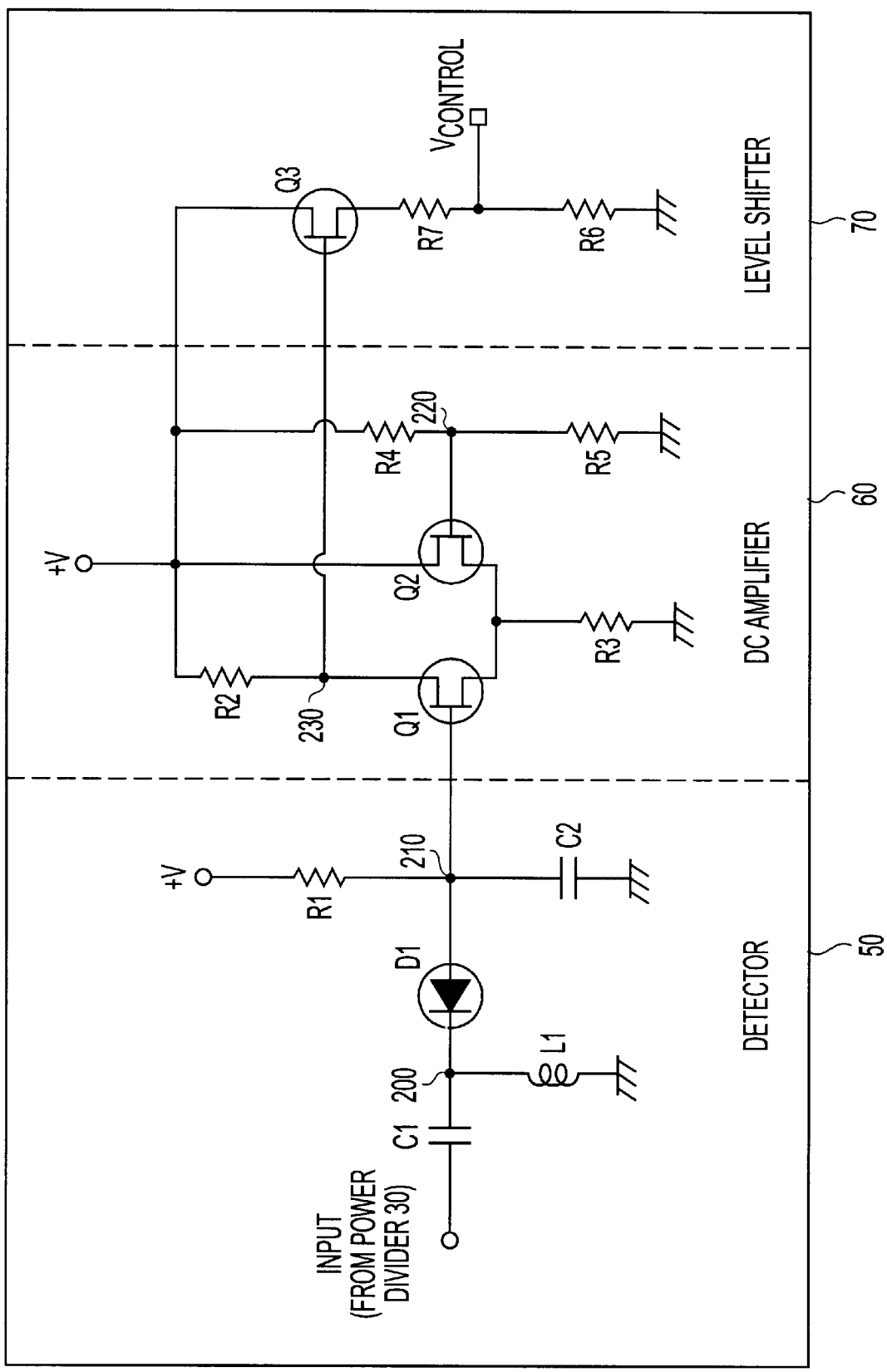
FIG. 2 is a schematic circuit diagram for the RF detector, DC amplifier, and level shifter blocks shown in FIG. 1.

FIG. 2 is a schematic circuit diagram illustrating an embodiment of RF detector 50, DC amplifier 60, and level shifter 70. In FIG. 2, the RF output from power divider 30 passes through DC blocking capacitor C1. Detector diode D1, given a small forward-bias current (about 20 microamperes for a typical Schottky diode detector) by resistor R1 and inductor L1, rectifies the RF signal by conducting current only when the voltage at node 200 is less than the voltage at node 210 minus the diode cut-in voltage (normally 0.6 V for a silicon diode). Diode D1 does not conduct when the voltage at node 200 is greater than the voltage at node 210 minus the diode cut-in voltage. The current through diode D1 accordingly follows the negative peaks of the input signal waveform with an inversely proportional linear relationship between the diode current and the input voltage.

The voltage at node 210 behaves as follows. When diode D1 is forward biased by a negative voltage at node 200, the voltage at node 210 tracks the voltage at node 200 (plus the voltage developed across diode D1, which is approximately 0.7 V for a silicon diode or 1.3 V for a GaAs diode. When diode D1 is reverse biased, however, the voltage at node 210 is held fixed by bypass capacitor C2. This capacitor should be sufficiently large that the voltage at node 210 tracks slow changes in the average output power of the RF amplifier rather than instantaneous changes in output power or in the modulation of the carrier. In the preferred embodiment, the size of bypass capacitor is selected to cause the video bandwidth of the detector to be about 1 Hz.

Thus, the output of the detector (the voltage at node 210) is a DC signal that is inversely proportional to the RF power output from power divider 30. When the RF power is small, the DC signal is large (more positive or less negative); when the RF power is large, the DC signal is small (less positive or more negative).

This DC signal then passes to DC amplifier 60, formed by resistors R2, R3, R4, and R5 and transistors Q1 and Q2. The transistors may be field-effect or bipolar-type transistors.

Resistors R4 and R5, connected in series between positive voltage supply +V and ground, create a reference voltage at node 220 through voltage division. This voltage at node 220 ($V_{220}$) is determined by the ratio of the values of R4 and R5:

$$V_{220} = +V * \frac{R5}{R4 + R5}$$

Transistors Q1 and Q2 and resistors R3 and R2 form a conventional differential amplifier. Resistor R2 sets the gain of the differential amplifier, while resistor R3 sets the current through transistors Q1 and Q2. In a preferred embodiment, resistor R3 is quite large in relation to resistor R2.

The output of DC amplifier 60 is the voltage at node 230 ($V_{230}$), which is proportional to the difference between the voltage $V_{210}$ at the gate of transistor Q1 and the reference voltage $V_{220}$. $V_{230}$ is thus proportional to, and inverted to, $V_{210}$. For example, an increase in the RF detector 50 output voltage at node 210 would cause a decrease in the voltage at node 230, and vice versa. The magnitude of $V_{230}$ is, of course, determined by the gain of the differential amplifier.

The voltage at node 230 ($V_{230}$) is then input to level shifter 70, which in one embodiment comprises a buffering transistor Q3 and resistors R6 and R7, which provide the DC voltage level-shifting. Resistors R6 and R7 are selected to provide an appropriate range for the bias control voltage $V_{CONTROL}$. The magnitude of this voltage is dependent on the RF amplifier design and, in a preferred embodiment, varies about 100 mV over the full range of RF output power.

To summarize, when an input signal is present at the input of capacitor C1, detector 50 causes a proportional inverted signal to appear at node 210. The DC amplifier 60 then inverts the inverted signal to a non-inverted, amplified signal, and level shifter 70 shifts the amplified signal to a range appropriate for biasing RF amplifier 20. When the input signal power is small, the RF amplifier bias voltage will be small, and when the input signal is large, the RF amplifier bias voltage will be large. Thus, the quiescent operating point of RF amplifier 20 is continuously adjusted so that RF amplifier 20 operates in a more linear range on its I-V curve, and the third order IMD is maintained on the theoretically-expected curve even at high RF output power.

Figure 3:
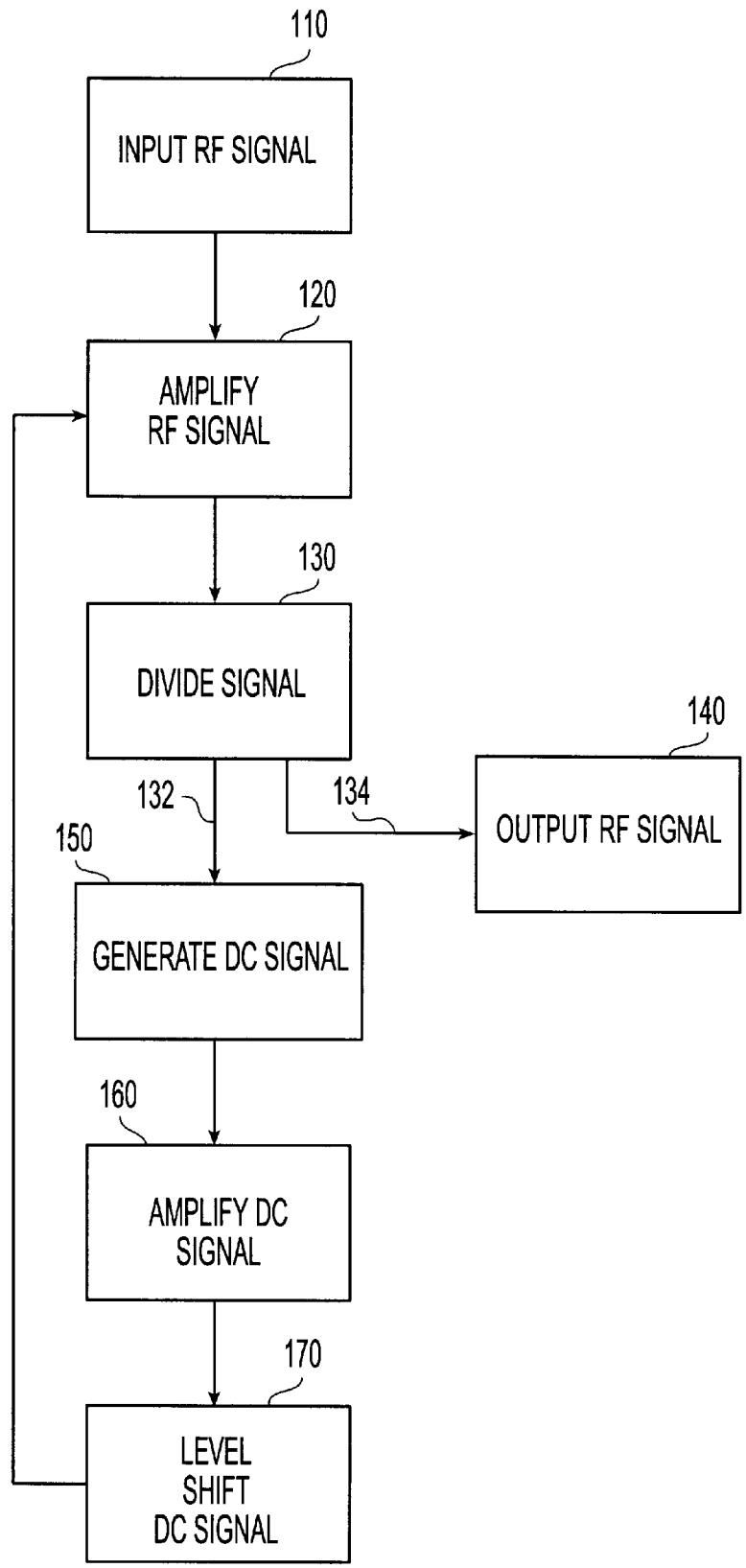
FIG. 3 is a flowchart of the method of the invention for maintaining the theoretically-expected 3:1 third-order distortion slope for output power.

FIG. 3 is a flowchart illustrating the method of the invention for maintaining third-order IMD products on the theoretical 3:1 slope. While it is preferred that the steps be performed by a circuit configuration similar to the one shown in FIG. 1 and described above, alternative configurations may also be used.

In step 110, the RF signal to be amplified is input. This signal is amplified in step 120. The amplified signal is then divided at step 130. Preferably, division of the amplified signal is unequal, with the signal fed along path 132 having a strength less than that fed along path 134. This is to minimize the through loss of the RF signal. It is preferred that the strength of the signal fed along path 132 be at least 10 dB less than the strength of the signal fed along path 134. The portion of the divided signal fed along path 132 is then used at step 150 to generate a DC signal with a voltage proportional to the RF signal input along path 132. This DC signal is preferably amplified at step 160 and level-shifted at step 170 so that it can be fed back to step 120.

The portion of the divided signal fed along path 134 is output as the amplified RF signal at step 140. The steps of amplifying 160 and level-shifting 170 the DC signal have the effect of increasing the DC bias used at the RF amplification step 120 at such a rate that the third-order IMD remains on the theoretical 3:1 slope.

While the invention has been described with reference to a specific embodiment, it will be appreciated by those of ordinary skill in the art that modifications can be made to the structure and form of the invention without departing from its spirit and scope, which is defined in the following claims.

What is claimed is:

1. A circuit for amplifying an input RF signal comprising:
   (a) an RF amplifier having an input port that receives such input RF signal and an output port, wherein said RF amplifier produces at said output port an amplified RF signal comprising a third-order intermodulation distortion product signal;
   (b) a power divider that is connected to said output port of said RF amplifier to divide said amplified RF signal into an output RF signal and a feedback signal; and
   (c) a feedback circuit connected to said power divider to detect said feedback signal and to produce a DC voltage that is proportional to the power of said feedback signal and that is used to bias said RF amplifier circuit;
   wherein said DC voltage causes said third-order intermodulation distortion product signal to increase about three decibels in response to each one-decibel increase in the level of said input RF signal over a predetermined range of power of said output RF signal.

2. The circuit according to claim 1 wherein said power divider circuit produces said RF output signal and said feedback signal with equal strength.

3. The circuit according to claim 1 wherein said power divider circuit produces said RF output signal and said feedback signal with unequal strength.

4. The circuit according to claim 1 wherein said feedback signal has a strength at least ten decibels less than said RF output signal.

5. The circuit according to claim 1 wherein said feedback circuit comprises an RF detector that provides said DC voltage.

6. The circuit according to claim 5 wherein said feedback circuit further comprises a DC amplifier that amplifies said DC voltage and a DC level shifter that shifts the level of the amplified DC voltage.

7. The circuit according to claim 6, wherein said DC amplifier comprises:

(a) a reference voltage circuit; and (b) a differential amplifier circuit that receives at one input a reference voltage signal generated by said reference voltage circuit and at a second input said DC voltage.

8. The circuit according to claim 6, wherein said DC level shifter comprises:

(a) a transistor having an input terminal coupled to the output of said DC amplifier, a supply terminal coupled to a supply voltage, and a source terminal; and (b) a first resistor coupled between said source terminal of said transistor and ground.

9. The circuit according to claim 8, wherein said DC level shifter additionally comprises:

(a) a second resistor coupled between said source terminal of said transistor and said first resistor; and wherein said first resistor is coupled between said second resistor and ground.

10. The circuit according to claim 5, wherein said RF detector comprises:

(a) a DC blocking capacitor capable of receiving said feedback signal;

(b) an inductor connected at a first end to said DC blocking capacitor and at a second end to ground;

(c) a detector diode connected at a first end to the node formed by the connection of said DC blocking capacitor and said inductor;

(d) an RF bypass capacitor connected at a first end to a second end of said detector diode and at a second end to ground; and (e) a bias resistor, connected between a positive supply voltage and the node formed by the connection of said detector diode and said RF bypass capacitor, whereby the DC voltage proportional to the power of said feedback signal is produced.

11. The circuit according to claim 1 wherein said power divider circuit comprises a coupler, said coupler comprising a ferrite core.

12. The circuit according to claim 1 wherein said power divider circuit comprises one or more resistors.

13. The circuit according to claim 1 wherein said RF amplifier circuit comprises a metal-semiconductor field-effect transistor.

14. A method for amplifying an input RF signal comprising the steps of:

(a) amplifying said input RF signal in an amplifier to produce an amplified signal;

(b) dividing said amplified signal into an output RF signal and a feedback signal, said output RF signal comprising a third-order intermodulation distortion product signal;

(c) generating a DC signal with a DC voltage proportional to the power of said feedback signal; and (d) biasing said amplifier based on said DC signal;

wherein the DC voltage causes said third-order intermodulation distortion product signal to increase substantially three decibels in response to each one-decibel increase in the level of said input RF signal, over a predetermined range of power of said output RF signal.

15. The method according to claim 14 wherein said step of dividing produces said output RF signal and said feedback signal with equal strength.

16. The method according to claim 14 wherein said step of dividing produces said output RF signal and said feedback signal with unequal strength.

17. The method according to claim 14 wherein said step of dividing produces said output RF signal and said feedback signal such that said feedback signal has a strength at least ten decibels less than said RF output signal.

18. The method according to claim 14 further comprising the steps of:

(a) amplifying said DC signal; and (b) shifting said DC signal.

19. The method according to claim 18 wherein said step of amplifying said DC signal comprises the steps of:

(a) providing a reference voltage to one input of a differential amplifier circuit; and (b) providing said DC signal to a second input of the differential amplifier.

20. The method according to claim 18 wherein said step of shifting said DC signal comprises the steps of:

(a) providing said amplified DC signal to the input terminal of a transistor;

(b) providing a supply voltage to the supply terminal of said transistor; and (c) connecting a first resistor between said source terminal of said transistor and ground.

21. The method according to claim 20 wherein said step of shifting said DC voltage additionally comprises the step of:

(c) connecting a second resistor in series between said supply terminal of said transistor and said first resistor.

22. The method according to claim 18 wherein said step of generating a DC signal comprises:

(a) blocking the DC component of said feedback signal;

(b) inputting the signal produced in step (a) to a detector diode that is forward-biased by a small current; and (c) stabilizing the output of the detector diode via an RF bypass capacitor connected at a first end to the output of the detector diode and at a second end to ground.

* * * * *